US006809568B2

United States Patent
Kamel et al.

(10) Patent No.: US 6,809,568 B2
(45) Date of Patent: Oct. 26, 2004

(54) DYNAMIC ON CHIP SLEW RATE CONTROL FOR MOS INTEGRATED DRIVERS

(75) Inventors: Ashraf K. Kamel, Kokomo, IN (US); Terrell Anderson, Carmel, IN (US); David D. Moller, Westfield, IN (US)

(73) Assignee: Delphi Technologies, Inc., Troy, MI (US)

( * ) Notice: Subject to any disclaimer, the term of this patent is extended or adjusted under 35 U.S.C. 154(b) by 212 days.

(21) Appl. No.: 10/096,198

(22) Filed: Mar. 12, 2002

(65) Prior Publication Data

US 2003/0174004 A1 Sep. 18, 2003

(51) Int. Cl.[7] ................................................ H03K 5/12
(52) U.S. Cl. ...................................... 327/170; 327/513
(58) Field of Search .............................. 327/170, 172, 327/175, 512, 513, 530

(56) References Cited

U.S. PATENT DOCUMENTS 5,094,546 A * 3/1992 Tsuji ........................... 374/178
6,362,910 B1 * 3/2002 Tokita ......................... 359/180
6,366,153 B1 * 4/2002 Arslain et al. ............... 327/512
6,437,622 B1 * 8/2002 Tinsley et al. .............. 327/175

* cited by examiner

Primary Examiner—Timothy P. Callahan
Assistant Examiner—Cassandra Cox
(74) Attorney, Agent, or Firm—Stefan V. Chmielewski; Jimmy L. Funke

(57) ABSTRACT

A slew rate control system for a circuit includes a temperature sensitive device generates a temperature signal. A temperature dependent current source generates a first current source signal. A slew rate controller activates in response to the temperature signal when the temperature exceeds a first threshold. The slew rate controller then generates a slew rate control signal by adjusting slew rate as a function of the temperature signal. The slew rate controller then activates the temperature dependent current source in response to the slew rate control signal.

18 Claims, 5 Drawing Sheets

DYNAMIC ON CHIP SLEW RATE CONTROL FOR MOS INTEGRATED DRIVERS

TECHINCAL FIELD

The present invention relates generally to slew rate control, and more particularly to dynamic on chip slew rate control.

BACKGROUND ART

Slew rate is a ratio of the rise or fall in voltage to the length of time required for that rise or fall. Consequently, slew rate tends to be a controlling factor in the performance characteristics of electronic devices. A device having a low slew rate can degrade the performance and speed of a system containing the device, while a device having a high slew rate may not allow a system to react to changes in the state of the device and thereby cause errors in the system.

The effects of slew rates have led manufacturers of systems requiring processors, such as automotive electronic systems, to specify performance parameters into which device slew rate characteristics must fall in order to properly operate within those systems. Process variations between different fabrication methods, however, tend to cause large variations in device characteristics, such as drain to source current. Characteristic variations substantially bar devices from consistently exhibiting slew rate characteristics within the performance requirements. Therefore, substantial need exists for a buffer that allows adjustment of slew rate characteristics after a circuit or device has been manufactured.

The output current of typical semiconductor drivers varies with process, temperature, and supply voltage. To guarantee the desired operation for nominal values, typical drivers are designed to output nominal currents, which are greater than minimum current required under normal operating conditions. During rapid electrical processes, these currents can potentially become several times greater than the minimum required. Large currents tend to result in high voltage slew rates, which inject noise into analog portions of mixed signal systems.

Power transistors, such as Metal-Oxide Semiconductor (MOS) transistors, dissipate large amounts of power in their collector-base junctions. The dissipated power is converted into heat, which raises the junction temperature. The junction temperature should not exceed a component specific maximum temperature, or the transistor will stiffer permanent damage. The range for typical transistors is between 150° C. and 200° C.

Most automotive power integrated circuits (ICs) have a slew control on the output voltage to minimize radiated emissions in compliance with requirements in automotive electronics systems, which typically require slew rates around 1 V/$\mu$s. A difficulty encountered in many circuits having very large inductive loads, however, is power dissipation. For clamped inductive loads, a lower slew rate value causes an increase in switching loses and leads to a rapid increase in junction temperature.

Most Automotive ICs include thermal shutdown protection circuits, which are typically set at 10 to 25 degrees above the recommended maximum temperature of 150° C. tip to which junctions are substantially operable. After junction temperature reaches this set value, the output driver is turned off. This operation allows the device to protect itself in case of thermal overload.

For reliability, it is desirable to prevent junction temperatures from exceeding 150° C. This limitation is generally accomplished through appropriate heat sinking and driver size. Under certain circumstances, however, these solutions are cost prohibitive and impractical. During development or early production phases, thermal issues require manual adjustments to the slew rate of the output driver. Developers and designers resultantly trade off between improved emissions it lower operating temperatures and improved thermal performance at higher operating temperatures. A system for controlling slew rate at various temperature conditions would substantially solve this problem.

The disadvantages associated with current slew rate control techniques hare made it apparent that a new technique to regulate slew rate is necessary. The new technique should reduce power dissipation generated from switching loses in integrated circuits with large output devices at substantially low cost and should also enable circuit designers to fine-tune the Output voltage slew rate as a function of temperature to obtain an optimal overall thermal performance. The present invention is directed to these ends.

SUMMARY OF THE INVENTION

The present invention provides a system and method for slew rate control. The present invention also provides a method for dynamic, on chip control of slew rate.

In accordance with one aspect of the present invention, a slew rate control system for a circuit, which includes a temperature sensitive device adapted to generate a temperature signal, is disclosed. A temperature dependent current source is adapted to generate a first current source signal. A slew rate controller is adapted activate in response to the temperature signal when the temperature exceeds a first threshold. The slew rate controller is further adapted to generate a slew rate control signal by adjusting slew rate as a function of the temperature signal. The slew rate controller is further adapted to activate the temperature dependent current source in response to the slew rate control signal.

In accordance with another aspect of the present invention, a method for reducing power dissipation in a circuit having an output device, comprising: activating a slew rate controller in response to a temperature rise in an element of the circuit above a threshold; regulating said slew rate as a function of said temperature increase above said threshold; and generating a slew rate control signal, is disclosed.

One advantage of the present invention is that it facilitates substantially optimal performance at lower temperatures and optimal thermal performance at higher temperatures. A further advantage is that it protects the circuit during thermal overload. Additional advantages and features of the present invention will become apparent from the description that follows and may be realize by the instrumentalities and combinations particularly pointed out in the appended claims, taken in conjunction with the accompanying drawings.

DETAILED DESCRIPTION

The present invention is illustrated with respect to slew rate control system, particularly suited to the automotive field. The present invention is, however, applicable to various other uses that may require slew rate control, as will be understood by one skilled in the art.

Figure 1:
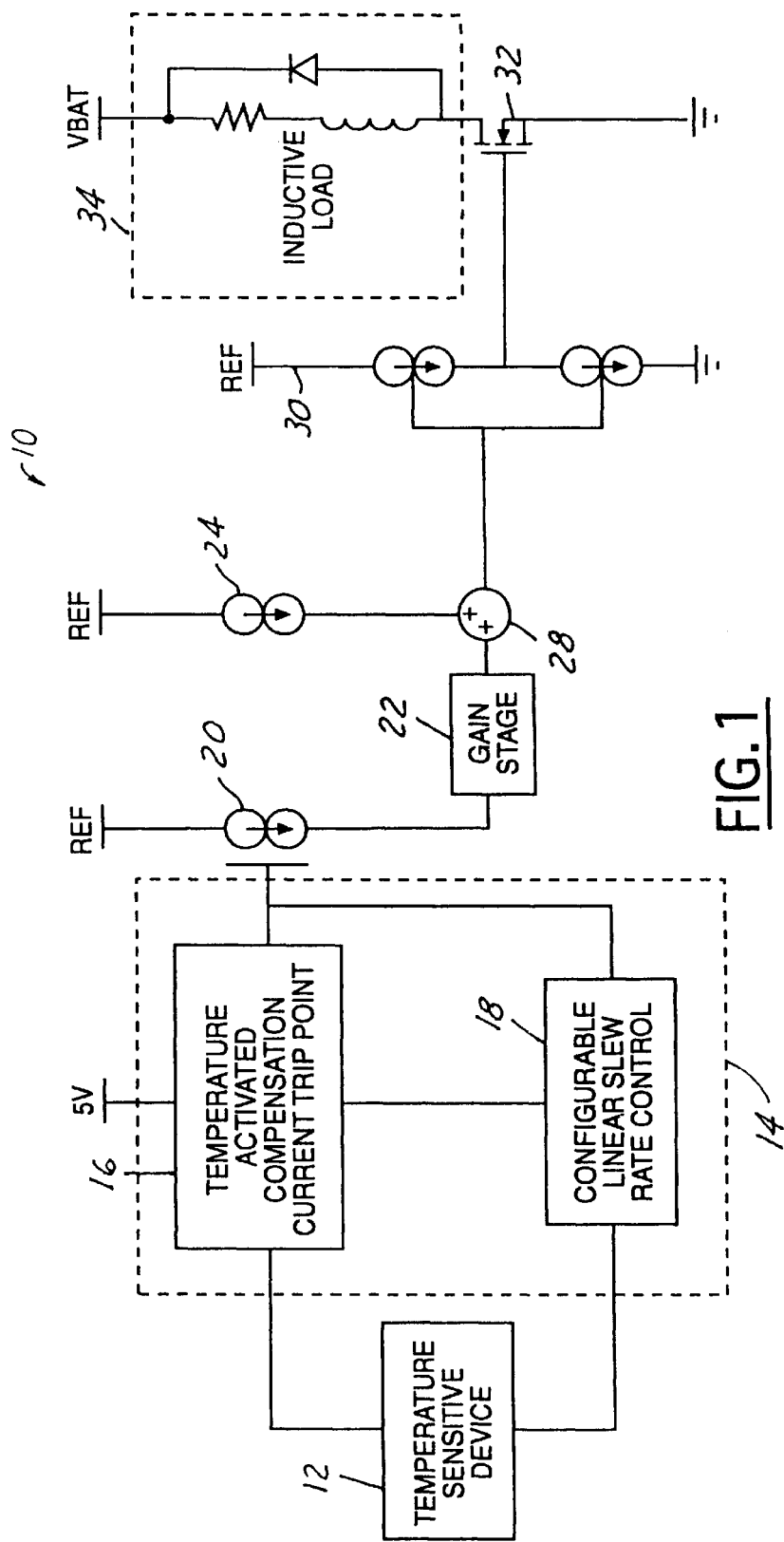
FIG. 1 is a slew rate control system in accordance with an embodiment of the present invention.

Referring to FIG. 1, a slew rate control system 10, includes it temperature sensitive device 12 electrically coupled to a slew rate controller 14. The slew rate controller includes a temperature activated compensation current trip point 16 and a configurable linear slew rate control 18. The slew rate controller is electrically coupled to a temperature dependent current source 20, which sends signals through a gain stage 22, and a temperature independent current source 24. Adder 28 is electrically coupled to the aforementioned current sources 20, 24. A push-pull current amplifier 30 is electrically coupled to the adder 28. A power transistor 32, electrically coupled to the push-pull current amplifier 30, sends slew rate controlled signals to the inductive load 34.

The temperature sensitive device 12 generates a temperature signal. The slew rate controller 14 activates in response to the temperature signal when the temperature exceeds a threshold, i.e. when the temperature activated compensation current trip point controller component 16 activates. The slew rate controller 14 further generates a slew rate control signal by adjusting the slew rate as a function of the temperature signal. The aforementioned operation is conducted in the configurable linear slew rate control component 18, which also controls the maximum allowable temperature for circuit components. The slew rate controller 14 still further activates the temperature dependent current source 20 in response to the slew rate control signal.

The temperature dependent current source 20 generates a current source signal, which is amplified in a gain stage 22 to generate the first current source signal. The temperature independent current source 24 generates a second current source signal. Adder 28 adds the first current source signal and the second current source signal and thereby generates an adder signal. A push-pull current amiplifier 30 amplifies current of the adder signal and thereby generates a load signal. A power transistor 32 receives the load signal and transfers the load signal to the inductive load 34.

Figure 2:
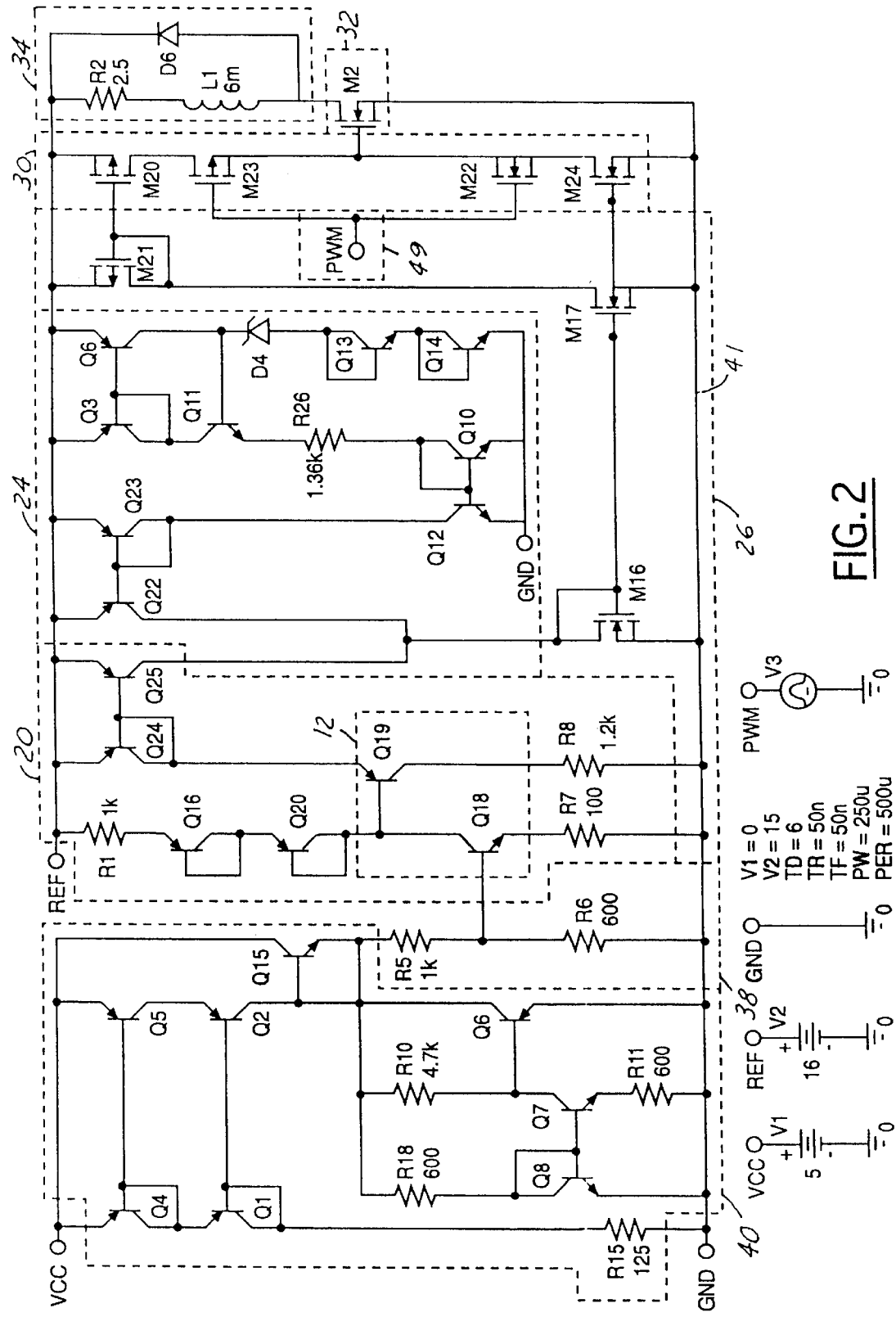
FIG. 2 is a schematic diagram of the slew rate control system of FIG. 1.

Referring to FIG. 2, a schematic diagram of the slew rate control system 10 of FIG. 1 is illustrated. The present invention is illustrated with respect to a plurality of transistors, diodes and resistors in a circuit 41. It will, however, be apparent to one skilled in the art that this serves only as an example of one embodiment, and numerous other combinations of electronic circuit components, such as integrated circuits, may alternately be used.

The system is illustrated with typical denotations used in the field of electronics, such as "M" for MOSFETs (Metal Oxide Semiconductor Field Effect Transistors), "Q" for BJTs (Bipolar Junction Transistors), "D" for diodes, "R" for resistors. "VCC" and "REF" for reference voltages, "GND" for the common ground, and "V" for voltage.

The temperature sensitive device generates a temperature signal. In the present embodiment, the temperature sensitive device 12 includes at least one transistor (Q18 and Q19) and the temperature signal is the resultant response of saturation of the transistor Q18 due to temperature increase. The temperature sensitive device 12 is alternately embodied as a temperature sensor measuring or sensing increases in temperature in or around either a component, array of components, component junction, or a combination thereof, as will be understood by one skilled in the art.

The temperature dependent current source 20 includes Q16, Q18, Q19, Q20, Q24, RI, R7 and R8. Q18 is biased by a voltage divider 38 from a bandgap reference 40 generating a fixed voltage of 1.42V. The bandgap reference 40 includes Q1, Q2, Q4, Q5, Q6, Q7, Q8, Q15, R10, R11, R15, and R18, and is designed in the illustrated system 10 to maintain system tolerance, as will be understood by one skilled in the art.

At elevated temperatures, the voltage of the base emitter junction (VBE) of Q18 drops linearly as temperature increases. Once the VBE becomes lower than the bias voltage by a value high enough to forward bias the junction, Q18 begins conducting and Q19 resultantly operates in the active region. Q19 is biased by Q28, Q16, Q24, R1 and Q18.

Figure 3:
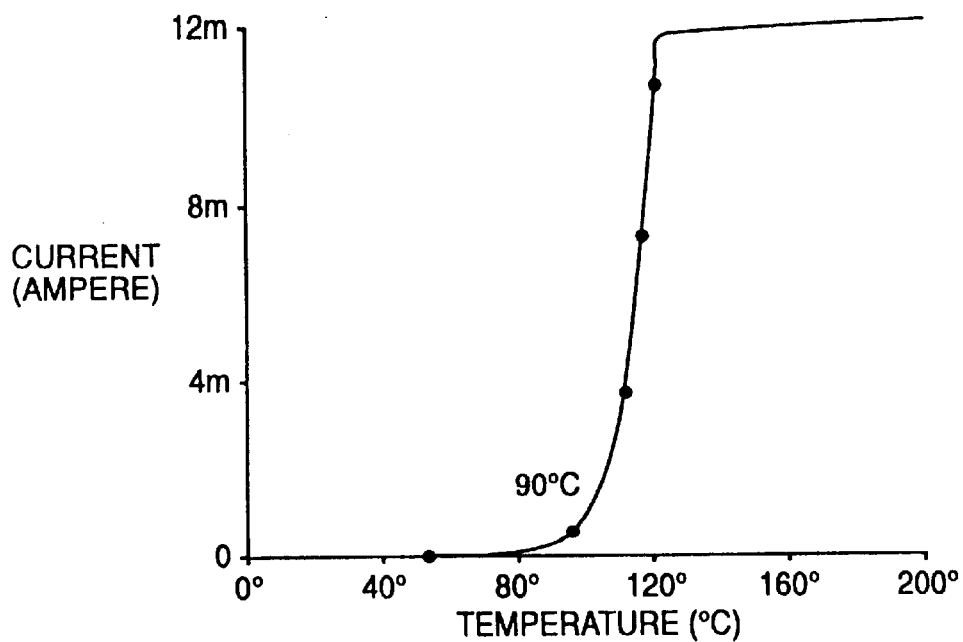
FIG. 3 is a graph of current as a function of temperature for a transistor of FIG. 2.

Referring to FIGS. 2 and 3, the current generated by Q19 as a function of temperature is illustrated. The current stays close to zero until the temperature reaches approximately 80° C. and then increases as temperature increases. When the temperature reaches approximately 120° C., Q19 is forced into saturation, and the current stays relatively constant. The compensation current is amplified in the gain stage 22, which includes Q24 and Q25, to generate a first current source signal. The gain stage 22 magnifies the relatively small signal that is usually produced from the temperature dependent current source 20. The first current source signal is added to the fixed current generated by Q11, and the resultant current or load signal is then directed to the power MOSFET device M2 (power transistor 32) through M16 and M17.

The slew rate controller 14 includes a means for linear adjustment of slew rate. R5, R6, and Q18 are the temperature activated trip point and R7, R8, and Q19 are the configurable linear slew rate control. The slew rate controller activates in response to the temperature signal when the temperature exceeds a threshold which, for the present invention, is approximately 120° C. (the saturation temperature for Q19). The threshold is adjusted either through control devices, known software control schemes, or, as illustrated, through manual adjustments varying the resistance of R6. R7 controls the slope of the current and is also adjusted either through control devices, known software schemes or, as illustrated, through manual adjustments varying the resistance of R7.

Figure 4:
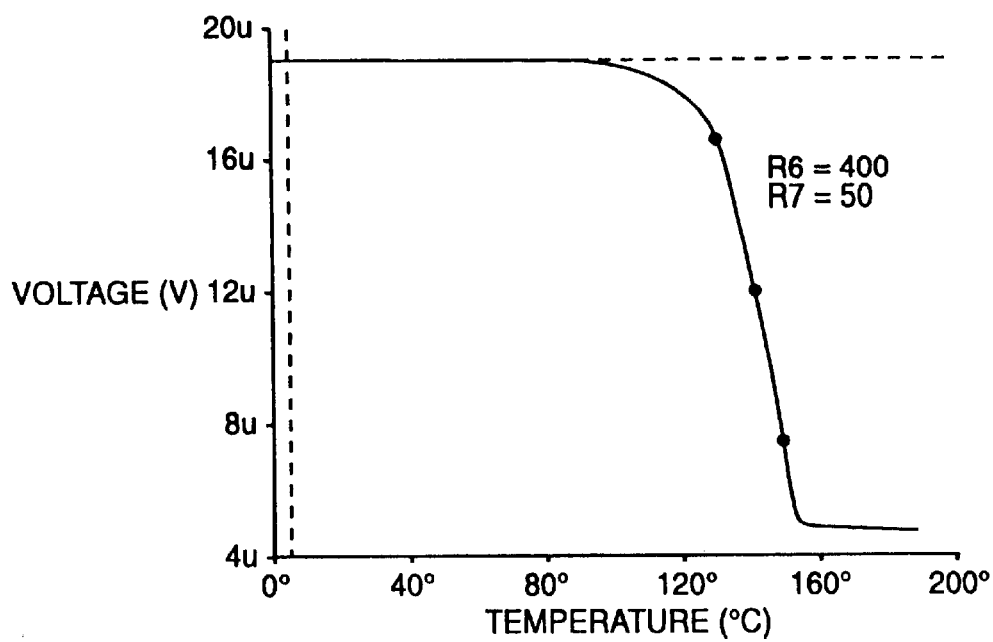
FIG. 4 is a graph of the rise and fall time as a function of temperature for the system of FIG. 2.
Figure 5:
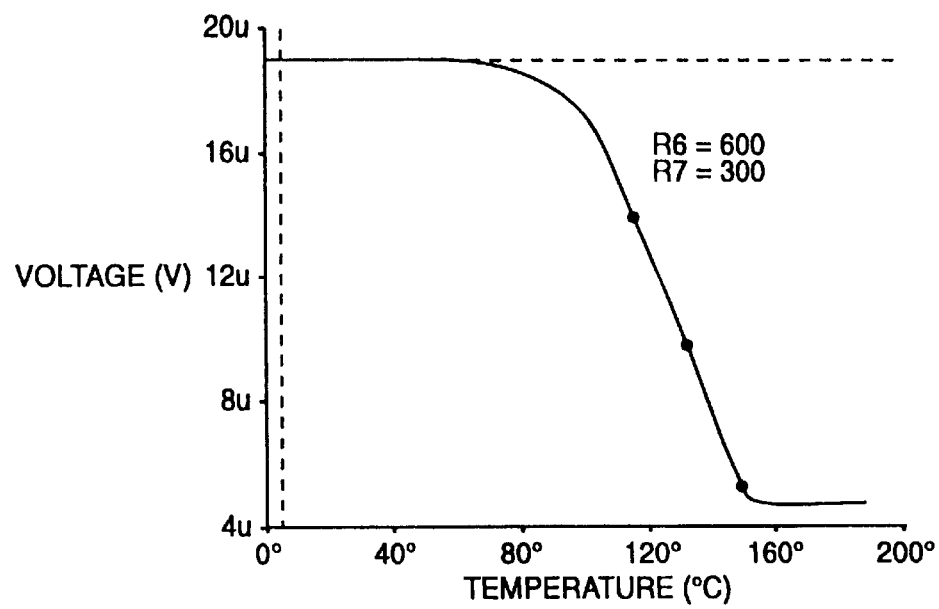
FIG. 5 is a graph of the rise and fall time as a function of temperature for the system of FIG. 2.

Referring to FIGS. 4 and 5, graphs of the rise and fall time as a function of temperature for the system 10 of FIG. 1 for different R6 and R7 values, are illustrated. FIG. 4 illustrates modification of slew rate compensation when the dynamic slow rate control system 10 is activated at 125° C. FIG. 1 illustrates modification of slew rate compensation when the dynamic slew rate control system 10 is activated at 90° C. FIGS. 4 and 5 illustrate that slew rate is modified by large amounts at different temperatures by varying R6 and R7.

Referring again to FIG. 2, the slew rate compensation system 10 includes resistors with low thermal coefficients. For alternate embodiments, i.e. resistors with high thermal coefficients, a thermal coefficient compensation device, such as a VBE multiplier, is included in the system 10 and added in series to the resistors. Such a thermal coefficient compensation device adds a fraction of negative thermal coefficients to the positive thermal coefficients generated by the resistors and thereby compensates for resistors with high thermal coefficients.

The slew rate controller 14 terminates the slew rate signal when the temperature reaches a maximum temperature allowable for at least one element of the circuit 41. R8 sets the final desirable value of the compensation current and therefore controls worst-case performance when the circuit 41 is active. R8 is also controlled either through control devices, software familiar in the art, or, as illustrated, through manual adjustments varying the resistance of R8.

A temperature independent current source 24, including Q3, Q10, Q11, Q12, Q13, Q14, Q22, Q23, R26, and D4, generates a second current source signal. Q11 generates the slew rate current. The current is independent of temperature variations because of the zener reference (D4) and the adding Q13 and Q14 to compensate for the negative thermal coefficients generated by the VBE of Q11 and Q10. as will be understood by one skilled in the art. Therefore temperature variations have only a minimal effect on current mirrored by Q23 and Q22.

An adder 28 (including M16, M17, and M21) sums the first current source signal and the second current source signal and thereby generates an adder signal.

A push-pull current amplifier 30 amplifies current of the adder signal and thereby generate a load signal push-pull transistors are biased at zero current and conduct only when the signal is present. The circuit operates where M20 and M22 push (source) current into the load 34 (L1, R2, and D6) when voltage coming into the push-pull current amplifier 30 is positive and M23 and M24 pull (sink) current from the load when the incoming voltage is negative. When the pulse-width modulated (PWM) signal from the PWM source 49 is low, the gate of M2 is charged through M22 and M20. When the PWM signal is high, M23 and M24 are turned on while M20 and M22 are turned off, this discharges the gate of M2. Resultantly, the slew rate can be greatly modified at any temperature by varying R6 and R7.

Figure 6:
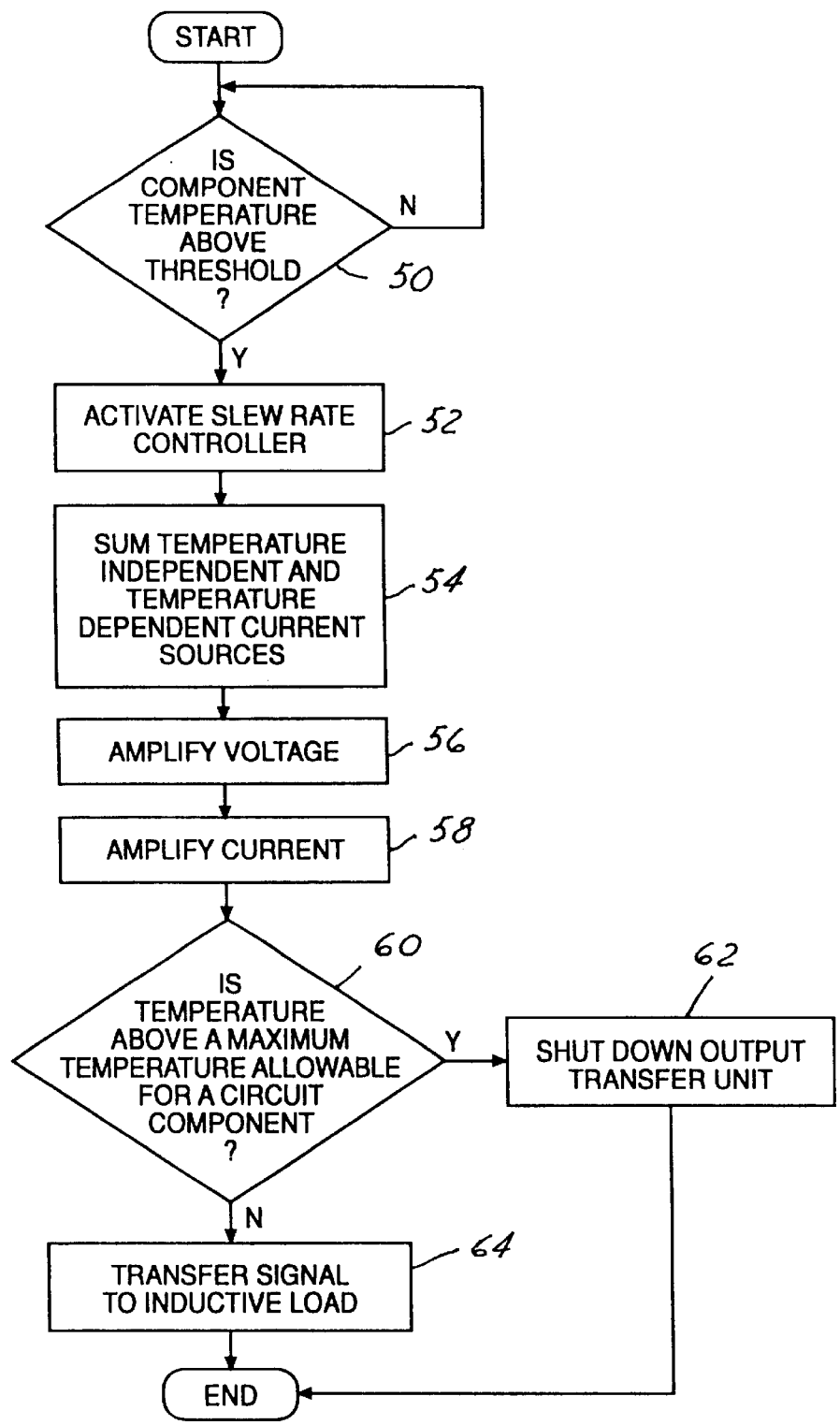
FIG. 6 is a block diagram of a method for reducing power dissipation due to slew rate in accordance with an embodiment of the present invention.

Referring to FIG. 6, a block diagram of a method for reducing power dissipation generated from at least one switching operation in a circuit having an output device, in accordance with an embodiment of the present invention, is illustrated. Logic starts in inquiry block 50 where an inquiry is made whether the temperature of a temperature sensitive component is above a predetermined threshold. For a negative response, the block diagram returns to the start function.

Otherwise, operation block 52 initiates, and the slew rate controller activates. The slew rate controller then adjusts the slew rate as a function of temperature, as was previously mentioned, aid generates a slew rate control signal. In operation block 54, the temperature dependent current source which operates in response to the slew rate control signal, and the temperature independent current source are summed to generate a load signal.

A check is then made in inquiry block 60 whether the temperature of the temperature sensitive component is above a maximum, which is ideally set by the slew rate controller. Block 60 is illustrated as sequential to block 58 however: this check is ideally made continuously during the functioning of the aforementioned circuit. For a positive response, operation block 62 activates and the output transfer unit (power transistor) is shut down. Important to note is that the slew rate controller alternately shuts down various other components or combinations thereof to protect the circuit, as will be understood by one skilled in the art.

Otherwise operation block 64 activates, and the load signal is transferred to the inductive load through the power transistor.

In operation, the slew rate controller automatically increases the output slew rate after a junction temperature reaches a preset value. If the temperature continues to rise, the slew rate controller continues to increase the slew rate until it reaches the maximum slew rate controllable by the circuit elements. If the temperature continues increasing, thermal shutdown turns off the output device. The present invention thereby generates the optimal performance at lower temperatures and optimal thermal performance at higher temperatures through dynamic adjustments to the slew rate.

From the foregoing, it can be seen that there has been brought to the art a new slew rate control system, which allows circuits to automatically increase output slew rates after a junction temperature reaches a preset value. It is to be understood that the preceding descriptions of various embodiments are merely illustrative of some of the many specific embodiments that represent applications of the principles of the present invention. Numerous and other arrangements would be evident to those skilled in the art without departing from the scope of the invention as defined by the following claims.

What is claimed is:

1. A slew rate control system for a circuit, comprising: a temperature sensitive device adapted to generate a temperature signal; a temperature dependent current source adapted to generate a first current source signal; a temperature independent current source adapted to generate a second current source signal; and a slew rate controller adapted to activate in response to said temperature signal when said temperature exceeds a first threshold, said slew rate controller further adapted to generate a slew rate control signal by adjusting a slew rate as a function of said temperature signal, said slew rate controller further adapted to activate said temperature dependent current source in response to said slew rate control signal.

2. The system of claim 1 wherein said temperature sensitive device comprises a transistor.

3. The system of claim 1 wherein said temperature sensitive device comprises a temperature sensor.

4. The system of claim 1 wherein said slew rate controller terminates said slew rate signal when said temperature reaches a maximum temperature value for at least one element of the circuit.

5. The system of claim 1 further comprising an adder is adapted to sum said first current source signal and said second current source signal and thereby generate an adder signal.

6. The system of claim 1 further comprising a push-pull amplifier adapted to amplify a current of said adder signal and thereby generate a load signal.

7. The system of claim 6 further comprising a power transistor adapted to receive said load signal and transfer said load signal to an inductive load.

8. The system of claim 1 wherein said slew rate controller comprises a plurality of transistors.

9. The system of claim 1 wherein said controller comprises a means for manual adjustment of slew rate.

10. The system of claim 1 wherein said controller comprises a means for linear adjustment of slew rate.

11. The system of claim 1 further comprising a bandgap reference.

12. A system for reducing power dissipation in a circuit adapted to supply an output voltage to an inductive load, comprising: a temperature sensitive device adapted to generate a temperature signal; a temperature dependent current source adapted to generate a first current source signal; a slew rate controller adapted to activate in response to said temperature signal when said temperature exceeds a threshold, said slew rate controller further adapted to generate a slew rate control signal by adjusting a slew rate as a function of said temperature signal, said slew rate controller further adapted to activate said temperature dependent current source in response to said slew rate control signal; a temperature independent current source adapted to generate a second current source signal; an adder adapted to sum said first current source signal and said second current source signal and thereby generate an adder signal; a push-pull amplifier adapted to amplify current of said adder signal and thereby generate a load signal; and a power transistor adapted to receive said load signal and transfer said load signal to an inductive load.

13. The system of claim 12 wherein said temperature sensitive device comprises a transistor.

14. The system of claim 12 wherein said temperature sensitive device comprises a temperature sensor.

15. The system of claim 12 wherein said slew rate controller terminates said slew rate signal when said temperature reaches a maximum temperature value for at least one element of the circuit.

16. The system of claim 12 wherein said controller comprises a means for manual adjustment of slew rate.

17. The system of claim 12 wherein said controller comprises a means linear adjustment of slew rate.

18. The system of claim 12 further comprising a bandgap reference.

* * * * *